(12) United States Patent
Krupka

(10) Patent No.: US 7,088,175 B2
(45) Date of Patent: Aug. 8, 2006

(54) LOW NOISE, ELECTRIC FIELD SENSOR

(75) Inventor: Michael Andrew Krupka, San Diego, CA (US)

(73) Assignee: Quantum Applied Science & Research, Inc., San Diego, CA (US)

( * ) Notice: Subject to any disclaimer, the term of this patent is extended or adjusted under 35 U.S.C. 154(b) by 0 days.

(21) Appl. No.: 10/641,325

(22) Filed: Aug. 14, 2003

(65) Prior Publication Data

US 2004/0070446 A1 Apr. 15, 2004

Related U.S. Application Data

(63) Continuation-in-part of application No. 09/783,858, filed on Feb. 13, 2001, now Pat. No. 6,686,800.

(51) Int. Cl.
*H03F 3/45* (2006.01)
*G01R 31/02* (2006.01)

(52) U.S. Cl. ............... 330/69; 330/293; 324/72

(58) Field of Classification Search ............ 330/69, 330/97, 259, 260, 104, 293
See application file for complete search history.

(56) References Cited

U.S. PATENT DOCUMENTS

| 3,500,823 A | 3/1970 | Richardson et al. |
| 3,565,060 A | 2/1971 | Sipple |
| 3,620,208 A | 11/1971 | Higley et al. |
| 3,722,677 A | 3/1973 | Lehnert |
| 3,744,482 A | 7/1973 | Kaufman et al. |
| 3,815,000 A | 6/1974 | Phillips et al. |
| 3,880,146 A | 4/1975 | Everett et al. |
| 3,882,846 A | 5/1975 | Fletcher et al. |
| 3,923,042 A | 12/1975 | Hajdu et al. |
| 4,248,244 A | 2/1981 | Charnitski et al. |
| 4,580,576 A | 4/1986 | Blackwood |
| 4,581,821 A | 4/1986 | Cahalan et al. |
| 4,602,639 A | 7/1986 | Hoogendoorn et al. |
| 4,669,479 A | 6/1987 | Dunseath, Jr. |
| 4,688,141 A | 8/1987 | Bernard et al. |
| 4,785,237 A | 11/1988 | Cox |
| 4,801,866 A | 1/1989 | Wixley |
| 5,001,440 A * | 3/1991 | Zerod .................. 330/284 |

(Continued)

FOREIGN PATENT DOCUMENTS

CA 2428250 11/2003

(Continued)

OTHER PUBLICATIONS

Byrne et al., Ground-Based Instrumentation for Measurements of Atmospheric ConductionCurrent and Electric Field at the South Pole, pp. 2611-2618, Journal of Geophysical Research, vol. 98, No. D2, Feb. 20, 1993.

(Continued)

*Primary Examiner*—Khanh Van Nguyen
(74) *Attorney, Agent, or Firm*—Diederiks & Whitelaw, PLC

(57) ABSTRACT

A system for measuring a free space electric field includes an ultrahigh impedance antenna positioned in the electric field to generate a signal from the electric field. An amplifier having an input port is provided to amplify the signal. The amplifier generates an input bias current which combines with the signal to create an input potential at the input port. An electrical circuit connects the input port to a ground connection and includes at least one circuit element for controlling the input potential to stabilize the signal at the input port.

16 Claims, 2 Drawing Sheets

U.S. PATENT DOCUMENTS

| | | | |
|---|---|---|---|
| 5,001,594 | A | 3/1991 | Bobbio |
| 5,015,906 | A | 5/1991 | Cho et al. |
| 5,039,312 | A | 8/1991 | Hollis |
| 5,090,643 | A | 2/1992 | Spears |
| 5,119,404 | A * | 6/1992 | Aihara ................. 330/69 |
| 5,191,891 | A | 3/1993 | Righter |
| 5,229,593 | A | 7/1993 | Cato |
| 5,289,822 | A | 3/1994 | Highe et al. |
| 5,304,941 | A * | 4/1994 | Tateishi ................. 330/290 |
| 5,325,073 | A * | 6/1994 | Hasegawa ............... 330/290 |
| 5,336,999 | A | 8/1994 | Mansfield |
| 5,485,092 | A | 1/1996 | Fortin |
| 5,488,677 | A | 1/1996 | Tokano |
| 5,574,805 | A | 11/1996 | Toba |
| 5,632,280 | A | 5/1997 | Leyde et al. |
| 5,645,527 | A | 7/1997 | Beck |
| 5,650,750 | A | 7/1997 | Leyde et al. |
| 5,670,870 | A | 9/1997 | Muramatsu |
| 5,699,015 | A | 12/1997 | Dotson |
| 5,717,361 | A * | 2/1998 | Saito ................. 330/290 |
| 5,734,296 | A | 3/1998 | Dotson |
| 5,751,192 | A | 5/1998 | Main |
| 5,781,003 | A | 7/1998 | Kondo |
| 5,795,293 | A | 8/1998 | Carim et al. |
| 5,798,673 | A | 8/1998 | Griffith |
| 5,896,035 | A | 4/1999 | Takahashi |
| 5,912,584 | A * | 6/1999 | Iizuka ................. 330/85 |
| 5,947,920 | A | 9/1999 | Beck |
| 6,096,220 | A | 8/2000 | Ohkawa |
| 6,104,817 | A * | 8/2000 | Ding ................. 381/96 |
| 6,111,466 | A | 8/2000 | Mokhtar et al. |
| 6,134,424 | A * | 10/2000 | Nishihori et al. ........... 330/290 |
| 6,242,911 | B1 | 6/2001 | Maschek |
| 6,246,287 | B1 * | 6/2001 | Yamashita ................. 330/69 |
| 6,262,631 | B1 | 7/2001 | Li |
| 6,388,525 | B1 * | 5/2002 | Bien ................. 330/282 |
| 6,411,108 | B1 | 6/2002 | Douglas et al. |
| 6,438,413 | B1 | 8/2002 | Taheri |
| 6,472,888 | B1 | 10/2002 | Oguma et al. |
| 6,535,059 | B1 * | 3/2003 | Lipperer et al. ............... 330/85 |
| 6,551,252 | B1 | 4/2003 | Sackner et al. |
| 6,611,168 | B1 | 8/2003 | Denison et al. |
| 6,755,795 | B1 | 6/2004 | Marmaropoulos et al. |
| 6,807,438 | B1 | 10/2004 | Brun Del Re et al. |
| 2002/0038092 | A1 | 3/2002 | Stanaland et al. |
| 2003/0036691 | A1 | 2/2003 | Stanaland et al. |
| 2003/0214408 | A1 | 11/2003 | Grajales et al. |
| 2004/0070446 | A1 | 4/2004 | Krupka |
| 2004/0073104 | A1 | 4/2004 | Brun Del Re et al. |

FOREIGN PATENT DOCUMENTS

| | | |
|---|---|---|
| WO | 01/16607 | 3/2001 |
| WO | 03/048789 | 6/2003 |
| WO | 03/79897 | 10/2003 |

OTHER PUBLICATIONS

Clippingdale et al., Ultrahigh Impedance Capacitively Coupled Heart Imaging Array, pp. 269-270, Rev. Sci. Instrum. 65 (1), Jan. 1994.

Clippingdale et al., Non-Invasive Dielectric Measurements with the Scanning Potential Microscope, pp. 2426-2430, J. Phys. D: Appl. Phys. 27 (1994).

Author Unknown, Ultra Low Input Bias Current Instrumentation Amplifier, pp. 1-9, Burr-Brown Corp 1994.

Harrison, An Antenna Electrometer System for Atmospheric Electrical Measurements, pp. 1599-1603, Rev. Sci. Instrum. 68 (3), Mar. 1997.

Maynard, Electric Field Measurements in Moderate to High Density Space Plasmas with Passive Double Probes, pp. 13-27, Geophysical Monograph 103, American Geophysical Union 1998.

Pedersen, Electric Field Measurements in a Tenuous Plasma with Spherical Double Probes, pp. 1-12, Geophysical Monograph 103, American Geophysical Union 1998.

Prance, Non-Contact VLSI Imaging Using a Scanning Electric Potential Microscope, pp. 1229-1235, Meas. Sci. Technol. 9 (1998).

Prance et al., An Ultra-Low-Noise Electrical-Potential Probe for Human-Body Scanning, pp. 1-7, Meas. Sci. Technol. 11 (2000).

Author Unknown, "Ultra Low Input Bias Current Instrumentation Amplifier", Burr-Brown Corp., pp. 1-9, 1994.

Clippingdale et al., "Ultra-High Impedance Voltage Probes and Non-Contract Electrocardiograpghy," Sensors: Technology, Systems and Applications, 1st Edition, IOP Publ. Ltd., pp. 469-472, 1991.

Clippingdale et al., "Non-Invasive Dielectric Measurements with the Scanning Potential Microscope," J. Phys. D: Appl. Phys., vol. 27, IOP Publ. Ltd., pp. 2426-2430, 1994.

David et al., "Insulated Electrocardiogram Electrodes," Med. & Biol. Eng., Peter Peregrinus Ltd., Great Britain, vol. 10, pp. 742-750, 1972.

Geddes, L.A., "Electrodes and the Measurement of Bioelectric Events," Wiley-Interscience, pp. 97-106, 1972.

Harland et al., "Electric Potential Probes—New Directions in the Remote Sensing of the Human Body," Meas. Sci. and Technol. vol. 13, pp. 163-169, 2002.

Harland et al., "Remote Detection of Human Electroencephalograms Using Ultrahigh Input Impedance Electric Potential Sensors," American Institute of Physics, vol. 81, No. 17, pp. 3284-3286, Oct. 2002.

Harland et al., "High Resolution Ambulatory Electrocardiographic Monitoring Using Wrist-Mounted Electric Potential Sensors," Meas. Sci. and Technol., vol. 14, pp. 923-928, 2003.

Horowitz et al. "The Art of Electronics," 2nd Edition, pp. 96-98, 183-187, 193-207, 209-210, 1989.

Nunez, P. L., "Electric Fields of the Brain: The Neurophysics of EEG," Oxford U. Press, New York, pp. 197-198, 1981.

Nunez et al., "Spatial-Temporal Structures of Human Alpha Rhythms: Theory, Microcurrent Sources, Multiscale Measurements, and Global Binding of Local Networks," Human Brain Mapping Wiley-Liss, Inc., vol. 13, pp. 125-164, 2001.

Prance et al., "Electrometer Arrays: Sensing of Spatio-Temporal ELF Fields," Proc. Marelec, London, pp. 3.4+, 1997.

Prance et al., "Non-Contact VLSI Imaging Using a Scanning Electric Potential Mircoscope," Meas. Sci. Technol. vol. 9, pp. 1229-1235, 1998.

Richardson, P.C., "The Insulated Electrode: A Pasteless Electrocardiographic Technique," 20th Annual Conference on Engineering in Medicine and Biology, pp. 15.7, Nov. 1967.

Srebo, R., "Localization of Visually Evoked Cortical Activity in Humans," J. Physiology, vol. 360, pp. 233-246, 1985.

Srinivisan et al., "Spatial Sampling and Filtering of EEG with Spline Laplacians to Estimate Cortical Potentials," Brain Topography, Human Sciences Press, Inc., vol. 8, No. 4, pp. 355-366, 1996.

* cited by examiner

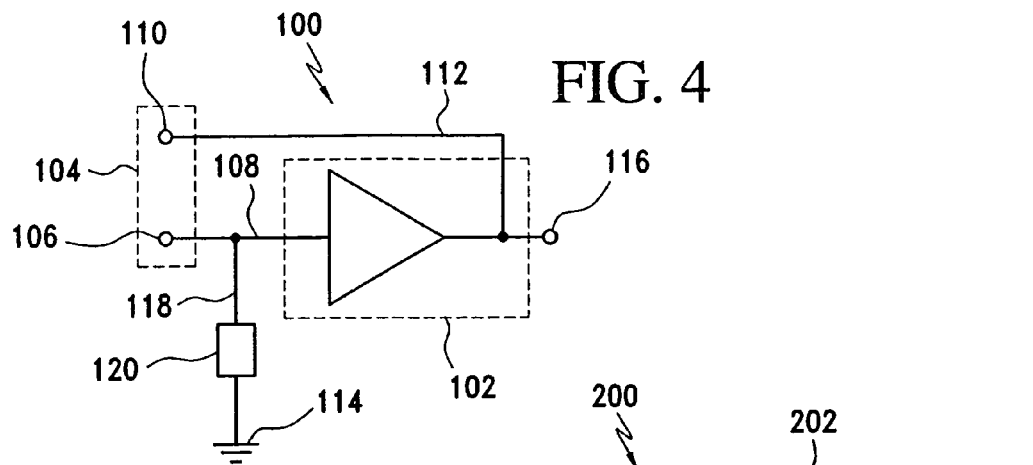
FIG. 4
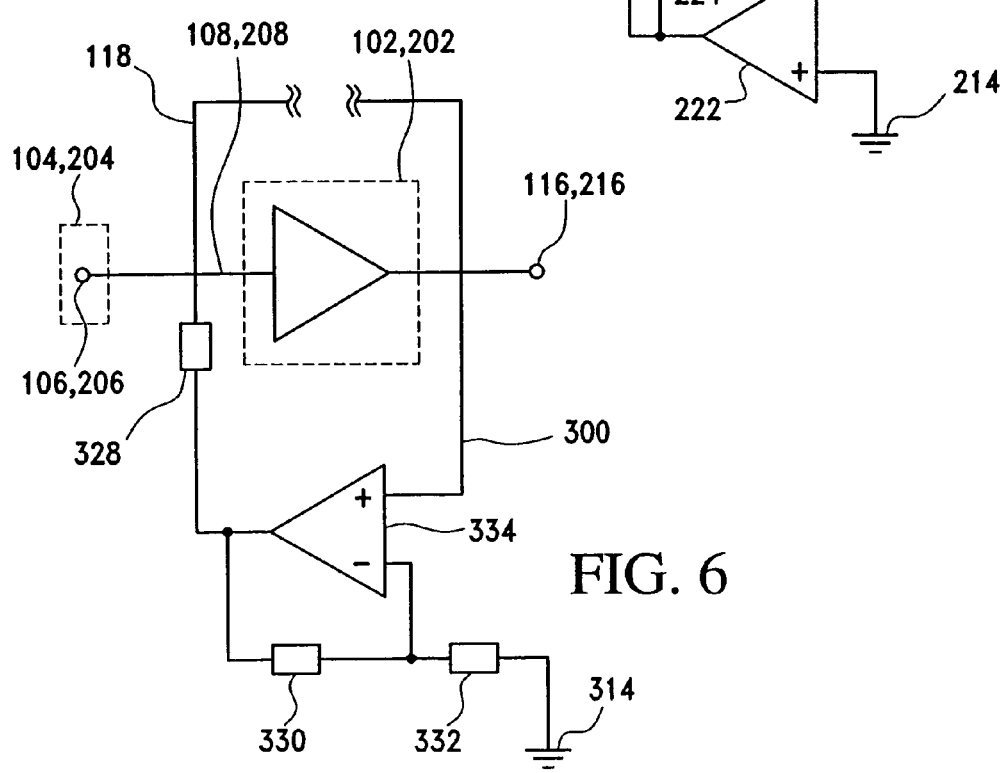
FIG. 5
FIG. 6

LOW NOISE, ELECTRIC FIELD SENSOR

This application is a continuation-in-part of U.S. patent application Ser. No. 09/783,858 filed Feb. 13, 2001, now U.S. Pat. No. 6,686,800, issued Feb. 3, 2004. The contents of U.S. patent application Ser. No. 09/783,858 are incorporated herein by reference.

FIELD OF THE INVENTION

The present invention pertains generally to electronic circuits. More specifically, the present invention pertains to electronic circuits which are useful for stabilizing the operation of an amplifier. The present invention is particularly, but not exclusively, useful as a circuit which removes the input bias current from the input potential to an ultrahigh input impedance amplifier in order to stabilize the amplifier's operation.

BACKGROUND OF THE INVENTION

It is well known that free space electric fields are emitted from many different types of sources. For example, it is known that organs in the human body, such as the heart and the brain, produce electric fields. Also, electric fields are produced whenever vehicles and machinery are operated. Further, they are emitted from many other diverse types of sources, such as active corrosion sites. In each case, for a variety of different reasons, it may be desirable to detect and measure these electric fields.

At low frequency, antennas that are effective for receiving signals from free space electric fields commonly have the properties of a pure voltage source that is in series with a very small capacitance. Consequently, electric field antennas will typically have an ultrahigh impedance that will often be in a range between ten and one hundred giga ohms (10–100 G$\Omega$). Due to this ultrahigh impedance, any amplifier that may be used to amplify signals of the electric field should have an ultrahigh input impedance.

By definition, "matching" involves adjusting a load impedance (e.g. amplifier) to the source impedance (e.g. antenna) so that maximum power is received. Stated differently, matching is necessary so that there is minimal reflection loss due to a mismatch between the source and the load. Accordingly, in order for an amplifier (load) to achieve high coupling efficiency and thereby effectively amplify the signals of an electric field (source) it is often necessary for the amplifier to have an ultrahigh input impedance. Additionally, this input impedance must be purely capacitive. The problem here, however, is that any resistive path of even very high resistance value at the amplifier input, will also act as a short to ground. This will then effectively insert an RC filter into the amplifier input circuit that will adversely affect the coupling between the antenna and the amplifier. For example, for an amplifier having an input impedance of 100 G$\Omega$, and a resistive path to ground of 1 G$\Omega$ at the amplifier input, only 1% of the signal will be coupled into the amplifier. Thus, it is generally desirable to remove resistive paths to ground at the amplifier input.

Although the removal of resistive paths from an amplifier input may improve the coupling efficiency of the amplifier, it will not necessarily solve all of the problems that are presented by an ultrahigh input impedance amplifier. Specifically, the removal of resistive paths from the amplifier input still does not account for the amplifier's inevitable input bias current. In general, the input bias current is a nonsignal current that is either d.c. in nature or has a very low frequency. In any event, unless the input bias current is somehow accounted for, it will flow onto the amplifier input capacitance and onto the source capacitance, and thereby produce a continual drift in the input signal level. This can then lead to saturation of the amplifier. For example, it can be shown that for an input bias current of 50 fA and an input capacitance of 10 pF, an amplifier with a gain of 1000 would saturate in approximately 2 seconds.

In light of the above it is an object of the present invention to provide a system and method for stabilizing an amplifier that enables an ultrahigh input impedance amplifier to be connected directly to a free space electric field antenna without the provision of a current path to ground to shunt the input bias current away from the amplifier input. Another object of the present invention is to provide a system and method for stabilizing an amplifier that allows the amplifier to be connected to ultrahigh impedance sources with high coupling efficiency. Still another object of the present invention is to provide a system and method for stabilizing an amplifier that is effectively easy to use, relatively simple to manufacture, and comparatively cost effective.

SUMMARY OF THE INVENTION

A system for stabilizing an ultrahigh input impedance amplifier includes an antenna for receiving an a.c. input signal from a free space electric field. The system also includes an input line that is used to feed the input signal from the antenna to an input port of the amplifier. As envisioned by the present invention, the amplifier will internally generate a substantially d.c. input bias current that combines with the input signal to create an input potential at the input port of the amplifier. As further envisioned by the present invention, the amplifier will also have a guard, and the same input potential will be established on the guard as well as at the input port. Recall, this input potential includes both the input signal and the input bias current.

In overview, for the operation of the system, the input potential is taken from the guard. The input bias current in this input potential is then separated from the input signal to establish a corrective signal. Next, the corrective signal is used to alter the input potential at the input port of the amplifier. The result is that the input bias current is effectively eliminated from the amplifier input. Consequently, the ultrahigh impedance of the antenna can be matched with the ultrahigh impedance of the amplifier, and the amplifier's operation can be stabilized.

In detail, for one embodiment of the present invention, a capacitor is connected to the guard of the amplifier. Specifically, in this embodiment the capacitor is used to remove the input bias current (essentially a d.c. signal) from the input potential. Thus, the input signal itself (an a.c. signal) is established as the corrective signal. Additionally, a high impedance path is connected between the capacitor and the amplifier's input port to influence the input potential at the input port with the corrective signal. More specifically, the corrective signal (i.e. input signal) from the capacitor blocks the input signal portion of the input potential at the diode to remove the input bias current from the input potential. The input bias current, by itself, is then provided a path to ground.

For an alternate embodiment of the present invention, a differential amplifier is contemplated. In this case, the system includes a low pass filter that is connected between the guard and an additional input port of the differential amplifier. The low pass filter then blocks transmission of the input signal (essentially a high frequency a.c. signal) in the input potential from the guard. Thus, the input bias current (a low frequency of d.c. signal) is used as the corrective signal. This corrective signal is then fed into the additional input port of the amplifier and is used in the amplifier to cancel the input bias current from the input potential at the input port.

In the specific case where a differential amplifier is used, a combination of the embodiments mentioned above can be incorporated. Specifically, the input potential at the guard can be fed through a low pass filter to the additional input port of the amplifier. As discussed above, this will allow the input bias current to be used for canceling itself in the amplifier. At the same time, the input potential at the guard can be passed through a capacitor to a high impedance path that is connected between the capacitor and the input port of the amplifier. As discussed above, this circuitry allows the input bias current in the input potential to be shunted to ground and to thereby remove the input bias current from the input potential.

In another aspect of the present invention, a system for measuring a free space electric field includes an ultrahigh impedance antenna positioned in the electric field to generate a signal from the electric field. An amplifier having an input port is provided to amplify the signal. The amplifier generates an input bias current which combines with the signal to create an input potential at the input port. An electrical circuit connects the input port to a ground connection and includes at least one circuit element for controlling the input potential to stabilize the signal at the input port.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 4 is an embodiment of a circuit for measuring a free space electric field having a resistor connected between the input port on an amplifier and ground;

FIG. 5 is an embodiment of a circuit for measuring a free space electric field having a resistor connected between the input port on an amplifier and ground and circuit elements for generating negative feedback for the amplifier; and FIG. 6 is an embodiment of a circuit for implementing a negative capacitance function which acts to eliminate the effect of the input capacitance of a signal amplifier.

DESCRIPTION OF THE PREFERRED EMBODIMENTS

Figure 1:
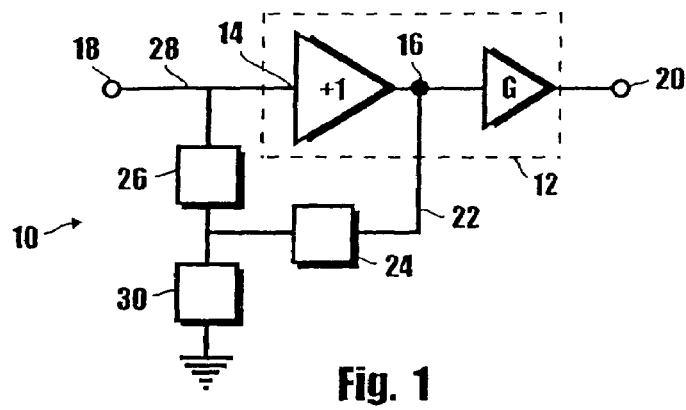
FIG. 1 is a circuit schematic drawing of a preferred embodiment of the present invention for use in stabilizing an ultrahigh input impedance amplifier.

Referring initially to FIG. 1, a circuit in accordance with the present invention is shown and is generally designated 10. As shown, the circuit 10 includes an amplifier 12 which has an input port 14 and a guard 16. As contemplated for the present invention, the guard 16 is of a type that is known to the skilled artisan. Essentially, the guard 16 provides a voltage that can be used to minimize leakage of the signal to the environment during passage to the input port 14 of the amplifier 12. Importantly, the input port 14 and the guard 16 will have the same input potential.

In accordance with the normal operation of an amplifier, the amplifier 12 receives an input signal 18; amplifies the input signal 18 by a gain, G; and then provides the amplified input signal 18 as an output 20. The present invention, however, contemplates that the input signal 18 is received from a source having an ultrahigh impedance which can disrupt the normal operation of an amplifier.

As is well known in the pertinent art, for the amplifier 12 to be operationally effective, the input impedance of the amplifier 12 needs to be matched to the input impedance of the source. When an ultrahigh impedance is involved, however, the input bias current that is inherently generated by an amplifier 12 can cause a rapid saturation of the amplifier 12. Further, the use of resistive paths from the input port 14 to ground, which can normally be used to shunt the input bias current from the input port 14 of the amplifier 12, can not be used when an ultrahigh impedance is involved. This is so because their presence effectively shunts the signal to ground to thereby divert it away from the amplifier input. As appreciated by the present invention, however, the input potential at both the input port 14 and the guard 16 will be the same, and it will include both the input signal 18 (an a.c. signal) and the input bias current of the amplifier 12 (essentially a d.c. signal). The solution, then, is to somehow remove the input bias current from the input potential at the input port 14.

Still referring to FIG. 1, for one embodiment of the present invention the circuit 10 includes a guard line 22, which interconnects the guard 16 with an electronic device 24. For purposes of the present invention, the device 24 is preferably a capacitor having a capacitance. The device 24 may, however, be a filter. In either case, the purpose of the device 24 is to isolate the input bias current (i.e. d.c. signal, or very low frequency signal) and separate it from the input signal 18 that is taken from the guard 16. Recall, the input potential at the guard 16, and at the input port 14, includes both the input signal 18 and the input bias current from the amplifier 12. The result for the circuit 10 shown in FIG. 1 is that the device 24 creates a corrective signal which is essentially the a.c. input signal 18. Further, for this embodiment of the present invention, another electronic device 26 is interconnected between the device 24 and the input line 28 that is used to feed the input signal 18 to the input port 14. For the present invention, the device 26 is preferably a diode of a type well known in the pertinent art. Specifically, the device 26 (diode) is connected into the circuit 10 so that the input potential at the input port 14 will interact with the corrective signal from the device 24 (i.e. the input signal 18). For the present invention, the diode of device 26 is connected backwards into the circuit 10. This is done to present a very high impedance to ground at the input port 14. Conduction through device 26 (diode) thus occurs via the leakage current of the device 26. This leakage current may be very small (e.g. a few pA). Alternatively the device 26 is a resistor of value sufficiently high to minimize conduction of the signal away from the amplifier input due to imbalance in the potentials of the guard line 22 and input line 28. The purpose here is for this interaction to block the input signal 18 from passing through the device 26. On the other hand, the concerted operation of the devices 24 and 26 allows the input bias current in the input potential to pass through the device 26 and through a resistor 30 to ground. Consequently, the input bias current is removed from the input potential at the input port 14.

Figure 2:
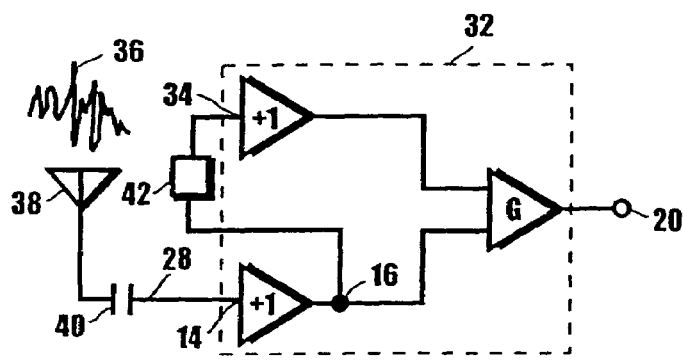
FIG. 2 is a circuit schematic drawing of another preferred embodiment of the present invention for use in stabilizing an ultrahigh input impedance differential amplifier.

Referring now to FIG. 2, an alternate embodiment of the present invention contemplates the use of a differential amplifier 32 that, along with the input port 14, also has an additional input port 34. Also, FIG. 2 illustrates an exemplary free space electric field 36 that is being received by an antenna 38. More specifically, the free space electric field 36 will include the input signal 18 and the antenna 38 will include a capacitance 40 that is actually part of the antenna 38. In effect, these components (electric field 36, antenna 38 and the capacitance 40 that is included in the antenna 38) represent a source that generates the input signal 18 and has an ultrahigh impedance input for the amplifier 32. At this point it is to be appreciated that the same type of source for input signal 18 (i.e. electric field 36, antenna 38 and capacitance 40) would also be representative of the input to the amplifier 12 discussed above with reference to FIG. 1.

In FIG. 2 it will be seen that an electronic device 42 is interconnected between the guard 16 and the additional input port 34 of the differential amplifier 32. Preferably, the device 42 is a low pass filter which passes signals having frequencies below approximately one tenth of a Hertz (<0.1 Hz). The purpose of this low pass filter (device 42) is to remove the input signal 18 from the input potential to create a corrective signal that effectively includes only the input bias current (d.c. signal). This corrective signal (i.e. the input bias current) is fed to the additional input port 34 of the amplifier 32 and is then used in the amplifier 32 to cancel the input bias current from the input potential.

Figure 3:
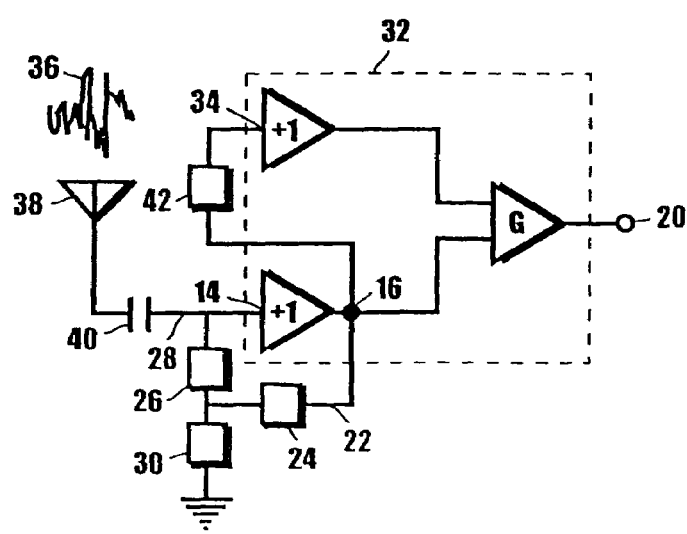
FIG. 3 is an alternate embodiment of the circuit shown in FIG. 2.

In yet another embodiment of the present invention, the circuitry shown in FIG. 1 is combined with the circuitry shown in FIG. 2. As shown in FIG. 3, for this embodiment of the present invention, a capacitor (device 24) and a diode (device 26) combine to eliminate the input bias current from the input potential. At the same time, a low pass filter (device 42) is also used to effectively achieve the same end.

An important aspect of the circuits respectively shown for the present invention in FIGS. 1, 2 and 3, is that they are all intended for use whenever there is an ultrahigh impedance input (e.g. 10–100 GΩ), such as is presented by a small antenna 38 used at low frequency. In operation, they all are incorporated to stabilize amplifiers 12, 32 by effectively removing the input bias current of the amplifiers 12, 32 from their input potential. Specifically, for the present invention, this is done by taking the input potential from the guard 16, and then separating the input bias current from the input signal 18 in the input potential to create a corrective signal. This corrective signal is then used as feedback to alter the input potential. The result is to effectively remove the input bias current from the input potential. Consequently, the amplifiers 12, 32 can use their respective gains, G, for subsequent detection and measurement of the input signal 18.

Referring now to FIG. 4, another system for measuring a free space electric field is shown and is generally designated 100. As shown, the system 100 includes an amplifier 102 which is typically a high input impedance unity gain amplifier, and can be, for example, an operational amplifier, an input of an instrumentation amplifier, or a transistor. The system 100 further includes a high impedance antenna 104 that can be positioned in the electric field. As shown, the antenna 104 has an electrode 106 that generates a signal from the electric field. It can further be seen that the electrode 106 is connected to an input port 108 of the amplifier 102. For the embodiment shown, the antenna 104 includes an electrode guard 110 that is connected to a guard line 112 of the amplifier 102. For the system 100, the amplifier 102 generates an input bias current which combines with the signal from the antenna 104 to establish an input potential at the input port 108.

Continuing with reference to FIG. 4, it can be seen that the system 100 measures an electric potential at the electrode 106 relative to a ground connection 114, producing an output signal 116. System 100 also includes a circuit 118 having a resistor 120, which typically has a value between 10 GΩ and 10,000 GΩ, to stabilize the signal at the input port 108 and prevent saturation of the amplifier 102.

Referring now to FIG. 5, another embodiment of a system for measuring a free space electric field is shown and is generally designated 200. As shown, the system 200 includes an amplifier 202 which is typically a high input impedance unity gain amplifier, and can be, for example, an operational amplifier, an input of an instrumentation amplifier, or a transistor. The system 200 further includes a high impedance antenna 204 that can be positioned in the electric field. As shown, the antenna 204 has an electrode 206 that generates a signal from the electric field. It can further be seen that the electrode 206 is connected to an input port 208 of the amplifier 202. For the system 200, the amplifier 202 generates an input bias current which combines with the signal from the antenna 204 to establish an input potential at the input port 208.

Continuing with reference to FIG. 5, it can be seen that the system 200 measures an electric potential at the electrode 206 relative to a ground connection 214 and produces an output signal 216. System 200 also includes an electrical circuit 218 having a resistor 220, which typically has a value between 10 GΩ and 10,000 GΩ, to stabilize the signal at the input port 208 and prevent saturation of the amplifier 202. FIG. 5 also shows that the electrical circuit 218 includes an amplifier 222 that implements a feedback path for the amplifier 202. In a first embodiment of the system 200, elements 224, 226 of the electrical circuit 218 are configured to establish a feedback path having a high gain at frequencies below a selected cutoff frequency and negligible gain (i.e. substantially no feedback) above the selected cutoff frequency. Those skilled in the pertinent art will appreciate that this frequency dependence can be implemented by using a parallel combination of a resistor and capacitor in element 224 and a resistor in element 226. The combination of the high gain and the inverting nature of the amplifier below the cutoff frequency causes the value of the resistor 220 to appear to be divided by the amplifier gain, while above the cutoff, the value of the resistor 220 is unaffected by the feedback path. With this cooperation of structure, the pickup of low frequency signals is reduced and a d.c. path for the input bias current of the signal amplifier 202 is provided.

Alternatively, the elements 224, 226 shown in FIG. 5 of the electrical circuit 218 can be configured to establish a low pass filter, a bandpass filter a high pass filter or a band stop filter. Those skilled in the pertinent art will appreciate that these filters can be implemented by using a parallel combination of a resistor and a capacitor in element 224 and a parallel combination of a resistor and a capacitor in element 226. With this cooperation of structure, the pickup of signals having selected frequencies can be reduced and a d.c. path for the input bias current of the signal amplifier 202 is provided. For example, when the electrical circuit 218 is configured as a bandpass filter, the circuit is insensitive over the range of frequencies in the bandpass. In any case, the electrical circuit comprises a means for generating a high gain negative feedback for the amplifier below a first selected cutoff frequency $v_1$, a high gain negative feedback for the amplifier above a second selected cutoff frequency $v_2$, and substantially no feedback at frequencies between $v_1$ and $v_2$.

Referring now to FIG. 6, a circuit 300 is shown for implementing a negative capacitance function which acts to eliminate the effect of the input capacitance of the signal amplifier 102, 202. The circuit 300 can be used in combination with any of the circuits described above which stabilize a signal amplifier. Specifically, as illustrated by FIG. 6, the circuit 300 can be used in the system 100 to eliminate the effect of the input capacitance of the signal amplifier 102 or in system 200 to eliminate the effect of the input capacitance of the signal amplifier. As shown, the circuit 300 includes a capacitor 328, circuit elements 330 and 332, and an amplifier 334. It can further be seen that the circuit 300 is connected to an input port 108, 208 of the amplifier 102, 202 which has an input capacitance, $C_{amp}$ and that the circuit 300 is connected to a ground connection 314.

For some embodiments of the circuit 300, the capacitor 328 has a capacitance, C, that is substantially equal to the input capacitance of the amplifier 102, 202 (i.e. $C=C_{amp}$). FIG. 6 also shows that the electrical circuit 300 includes an amplifier 334 that implements a feedback path for the amplifier 102, 202. Elements 330 and 332 of the electrical circuit 300 are typically configured to give the feedback path containing the amplifier 334 a gain of 2. With this cooperation of structure, the electrical circuit 300 implements a negative capacitance function that acts to eliminate the effect of the input capacitance on the signal amplifier 102, 202.

As described above, each system 100, 200 measures an electric field by measuring an electrical potential relative to ground. Alternatively, two systems (i.e. two system 100's, two system 200's or one system 100 and one system 200) could be used together to measure the electrical potentials of two separated points in free space, with one system 100, 200 measuring the electrical potential at a first point and the other system 100, 200 measuring the electrical potential at a second point. The electric field is then determined by taking the difference of these two measurements. This difference can be determined by analog or digital means. Preferably, the circuit grounds of each sensor are maintained at a common potential, for example, by connecting the ground connection of each circuit together. The response of each system 100, 200 can be calibrated independently, and correction factors applied before the subtraction is made, in order to improve the fidelity of the measurement.

While the particular Low Noise, Electric Field Sensor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A system for measuring a free space electric field, said system comprising:
   a ground connection;
   an ultrahigh impedance antenna positioned in the electric field for generating a signal from the electric field;
   an amplifier having an input port and an output port, wherein said amplifier generates an input bias current, said input bias current being combined with the signal to create an input potential at the input port;
   an electrical circuit connected to said input port and said ground connection, said electrical circuit having at least one circuit element for controlling said input potential to stabilize said signal at said input port; and
   a means connected between the output port and the input port for generating negative feedback for said amplifier below a selected cutoff frequency.

2. A system as recited in claim 1 wherein said circuit element is a resistor having a resistance in the range of 10 to 10,000 GΩ.

3. A system as recited in claim 1 wherein said electrical circuit establishes a feedback path for said amplifier.

4. A system as recited in claim 1 wherein said amplifier is selected from a group of amplifiers consisting of an operational amplifier, an instrumentation amplifier and a transistor.

5. A system for measuring a free space electric field, said system comprising:
   a ground connection;
   an ultrahigh impedance antenna positioned in the electric field for generating a signal from the electric field;
   an amplifier having an input port and an output port, wherein said amplifier generates an input bias current, said input bias current being combined with the signal to create an input potential at the input port;
   an electrical circuit connected to said input port and said ground connection, said electrical circuit having at least one circuit element for controlling said input potential to stabilize said signal at said input port; and
   a means connected between the output port and the input port for generating high gain negative feedback for said amplifier below a selected cutoff frequency and substantially no feedback above said selected cutoff frequency.

6. A system for measuring a free space electric field, said system comprising:
   a ground connection;
   an ultrahigh impedance antenna positioned in the electric field for generating a signal from the electric field;
   an amplifier having an input port and an output port, wherein said amplifier generates an input bias current, said input bias current being combined with the signal to create an input potential at the input port;
   an electrical circuit connected to said input port and said ground connection, said electrical circuit having at least one circuit element for controlling said input potential to stabilize said signal at said input port; and
   a means connected between the output port and the input port for generating a high gain negative feedback for said amplifier below a first selected cutoff frequency $v_1$, a high gain negative feedback for said amplifier above a second selected cutoff frequency $v_2$, and substantially no feedback at frequencies between $v_1$ and $v_2$.

7. A system for measuring a free space electric field, said system comprising:
   a ground connection;
   an ultrahigh impedance antenna positioned in the electric field for generating a signal from the electric field;
   an amplifier having an input port, an output port and an input capacitance at the input port, wherein said amplifier generates an input bias current, said input bias current being combined with the signal to create an input potential at the input port; and
   an electrical circuit connected to said input port and said ground connection, said electrical circuit having at least one circuit element for controlling said input potential to stabilize said signal at said input port and a means connected between the output port and the input port for eliminating the effect of said input capacitance of said amplifier.

8. A system as recited in claim 7 wherein said eliminating means comprises a capacitor.

9. A system as recited in claim 8 wherein said eliminating means further comprises an amplifier having a gain of two.

10. A system for measuring a free space electric field, said system comprising:

a ground connection;

an antenna positioned in the electric field for generating a substantially a.c. signal from the electric field;

an amplifier having an input port and an output port, wherein said amplifier generates a substantially d.c. input bias current, said d.c. input bias current being combined with the a.c. signal to create an input potential at the input port;

an electrical circuit connected to said input port and said ground connection, said electrical circuit having at least one circuit element for draining said d.c. input potential to said ground connection to stabilize said a.c. signal at said input port; and a means connected between the output port and the input port for generating negative feedback for said amplifier below a selected cutoff frequency.

11. A system as recited in claim 10 wherein said circuit element is a resistor having a resistance in the range of 10 to 10,000 GΩ.

12. A system as recited in claim 10 wherein said electrical circuit establishes a feedback path for said amplifier.

13. A system for measuring a free space electric field, said system comprising:

a ground connection;

an antenna positioned in the electric field for generating a substantially a.c. signal from the electric field;

an amplifier having an input port, an output port and an input capacitance at the input port, wherein said amplifier generates a substantially d.c. input bias current, said d.c. input bias current being combined with the a.c. signal to create an input potential at the input port;

an electrical circuit connected to said input port and said ground connection, said electrical circuit having at least one circuit element for draining said d.c. input potential to said ground connection to stabilize said a.c. signal at said input port; and a means connected between the output port and the input port for eliminating the effect of said input capacitance of said amplifier.

14. A method for measuring a free space electric field, said method comprising the steps of:

positioning an ultrahigh impedance antenna having an input capacitance in the electric field to generate a signal from the electric field;

connecting said antenna to an input port of an amplifier, wherein said amplifier generates an input bias current, said input bias current being combined with the signal to create an input potential at the input port;

connecting an electrical circuit to said input port and to a ground connection, said electrical circuit having at least one circuit element for controlling said input potential to stabilize said signal at said input port;

generating negative feedback for said amplifier below a selected cutoff frequency; and eliminating the effect of said input capacitance of said amplifier.

15. A method as recited in claim 14 wherein said circuit element is a resistor having a resistance in the range of 10 to 10,000 GΩ.

16. A method as recited in claim 14 wherein said electrical circuit establishes a feedback path for said amplifier.

* * * * *